United States Patent [19]

Ito et al.

[11] Patent Number: 5,099,788

[45] Date of Patent: Mar. 31, 1992

[54] METHOD AND APPARATUS FOR FORMING A DIAMOND FILM

[75] Inventors: Nobuei Ito; Minoru Yamamoto; Satoshi Nakamura; Tadashi Hattori, all of Okazaki, Japan

[73] Assignee: Nippon Soken, Inc., Nishio, Japan

[21] Appl. No.: 547,162

[22] Filed: Jul. 3, 1990

[30] Foreign Application Priority Data

Jul. 5, 1989 [JP] Japan .................. 1-173322

[51] Int. Cl.$^5$ ............................................. C23C 16/48
[52] U.S. Cl. .................... 118/666; 118/723; 118/725; 118/712; 118/729
[58] Field of Search ............... 118/723, 666, 725, 712, 118/729

[56] References Cited

U.S. PATENT DOCUMENTS

| | | | |
|---|---|---|---|
| 3,980,042 | 9/1976 | Stut | 118/664 |
| 4,767,608 | 8/1988 | Matsumoto | 427/39 |
| 4,851,254 | 7/1989 | Yamamoto | 427/34 |
| 4,883,560 | 11/1989 | Ishihara | 156/626 |
| 4,981,671 | 1/1991 | Moriyoshi | 427/39 |

OTHER PUBLICATIONS

Bachmann, *Diamond Thin Films*, Chemical and Engineering News, May 15, 1989, pp. 24-39.

*Primary Examiner*—Richard Bueker
*Attorney, Agent, or Firm*—Cushman, Darby & Cushman

[57] ABSTRACT

A method and apparatus for forming a diamond film, has a casing in which vacuum is maintained at a predetermined value. A substrate is disposed within the casing so that the diamond film is formed thereon. A gas plasma generator for generating a gas plasma near the substrate from a plasma source gas and a carbon source gas by an arc discharge is provided within the casing. A detector detects a factor which is related to a change in a surface temperature of the diamond film, and an electronic controller controls in response to the detected factor the surface temperature of the diamond film so as to maintain such temperature near a predetermined optimal value for forming the diamond film. As the surface temperature is maintained near the optimal value by a feedback control, high purity diamond film is obtained irrespective of the thickness or the forming time thereof.

8 Claims, 5 Drawing Sheets

METHOD AND APPARATUS FOR FORMING A DIAMOND FILM

BACKGROUND OF THE INVENTION

1. Field of the Invention

The present invention relates to a method and apparatus for forming a diamond film, and more particularly to a chemical vapor deposition (CVD) method of a diamond film by making use of an arc discharge.

2. Description of the Prior Art

Recently, chemical vapor deposition methods for forming a diamond film under low pressure have been noted. Such methods can be roughly classified into the following three types.

The first type is called a heat filament CVD method. According to this method, a tungsten filament heated at 2000° C. or higher is disposed just above a substrate which is at 800° C. through 1000° C., and a mixture gas of hydrogen and hydrocarbon such as methane is sprayed onto the substrate through the heated filament to grow a diamond film on the substrate.

The second type is called a microwave plasma CVD method. According to this method, a plasma is generated in a mixture gas of hydrogen and hydrocarbon by microwave of hundreds of watts to grow a diamond film on a substrate which is positioned within the generated plasma and is heated by the microwave at about 700° C. through 900° C.

In the above described two types of methods, atomic hydrogen accelerates the decomposition of methane, $CH_4$, and prevents the formation of other synthetic material such as amorphous carbon selectively.

The third type is a method using ion beam. According to this method, a diamond film is growed on the substrate by irradiating the substrate with ion beam of carbon.

The above described conventional forming methods of the diamond film have the problems that the forming speed is only several $\mu m/hr$ which is considerably slow for forming the diamond film with the thickness of 100 $\mu m$ or more to be used as a substrate for heat-sink for example.

In the meantime,, the inventors of the present invention found through their research that direct current arc discharge could be effectively used for the fast growth of the diamond film. The arc discharge is characterized in that electron temperature is as high as gas temperature which is more than several thousands°K. Accordingly, the decomposition of a mixture gas of hydrogen and hydrocarbon to be supplied as a plasma source gas is extraordinarily accelerated as compared with the heat filament CVD or microwave plasma CVD using glow discharge. As a result, the growing speed of a diamond film by a method using the direct arc discharge is 10 through 100 times faster than the above-mentioned conventional methods.

As shown in U.S. Pat. No. 4,851,254, the inventors of the present invention proposed a direct current arc method by which a plasma source gas is effectively used. According to this method, a plasma source gas is forced to pass through an arc discharge so as to form a gas plasma, and by aperture it changes to a gas plasma to be sprayed onto a substrate on which the diamond film is to be formed. However, the inventors of the present invention found the following problems about such method through their experiment.

As the plasma jet gas to be sprayed onto the substrate has a high temperature of several thousands°K, the rate of occurrence of impurity carbon (any kinds of carbons other than diamond) such as graphite becomes high when the surface temperature of the diamond film growing on the substrate exceeds 1000° C. under low pressure. Accordingly, both cooling the substrate and controlling the temperature are extremely important regarding the forming method using the plasma jet generated by arc discharge. In reference to this aspect, the inventors of this invention discovered that the surface temperature of the diamond film varies as the thickness thereof increases even if the cooling of the substrate is well done. More specifically, it was found that the surface temperature of the diamond film rises due to the athermalization as the thickness of the film increases (as the forming time increases), irrespective of the character of diamond having a high thermal-conductivity, and that such temperature increase of the film results in the high rate of impurity carbon.

FIG. 1 illustrates the data on the above explanation, indicating the Raman spectrum of the diamond film growth after the lapses of 1 Hr, 5 Hr, and 10 Hr from the start of the growth. Corresponding to the lapse of the forming time, the thicknesses of the diamond film are respectively 30 $\mu m$, 150 $\mu m$, and 300 $\mu m$ at each lapse of 1 Hr, 5 Hr, and 10 Hr from the start of the growth. According to the Raman spectrum data in FIG. 1, as the forming time is longer, namely as the diamond film is thicker, a peak of 1600 $cm^{-1}$, which indicates the impurity carbon such as graphite and differs from the diamond peak of 1330 $cm^{-1}$, is stronger.

SUMMARY OF THE INVENTION

It is an object of the present invention to provide a method and apparatus for forming a high purity diamond film irrespective of the thickness or the forming time thereof.

The apparatus for forming a diamond film, according to the present invention, has a casing in which vacuum is maintained at a predetermined value. A substrate is disposed within the casing so that the diamond film is formed thereon. A gas plasma generator for generating a gas plasma near the substrate from a plasma source gas and a carbon source gas by an arc discharge is provided within the casing.

A detector detects a factor which is related to a surface temperature of the diamond film, and an electronic control means controls in response to the detected factor the surface temperature of the diamond film so as to maintain such temperature near a predetermined optimal value for forming the diamond film.

The method for forming a diamond film on a substrate, according to the present invention supplies a plasma source gas and carbon source gas into a casing and a gas plasma is generated from the plasma source gas and the carbon source gas by an arc discharge. The gas plasma is directed onto a substrate disposed in the casing so as to form a diamond film. A factor which is related to a surface temperature of the diamond film is detected and, in response to the detected factor, the surface temperature of the diamond film is controlled so as to maintain such temperature at a predetermined optimal value.

According to the method and apparatus of the present invention, in response to the detected factor which indicates the change of the surface temperature of the diamond film, the surface temperature can be maintained at the predetermined value to form a high purity diamond film irrespective of the thickness or the forming time thereof.

By detecting the surface temperature of the diamond film directly, the surface temeprature thereof can be easily and precisely maintained at the predetermined value.

DETAILED DESCRIPTION OF THE PREFERRED EMBODIMENT

Figure 2:
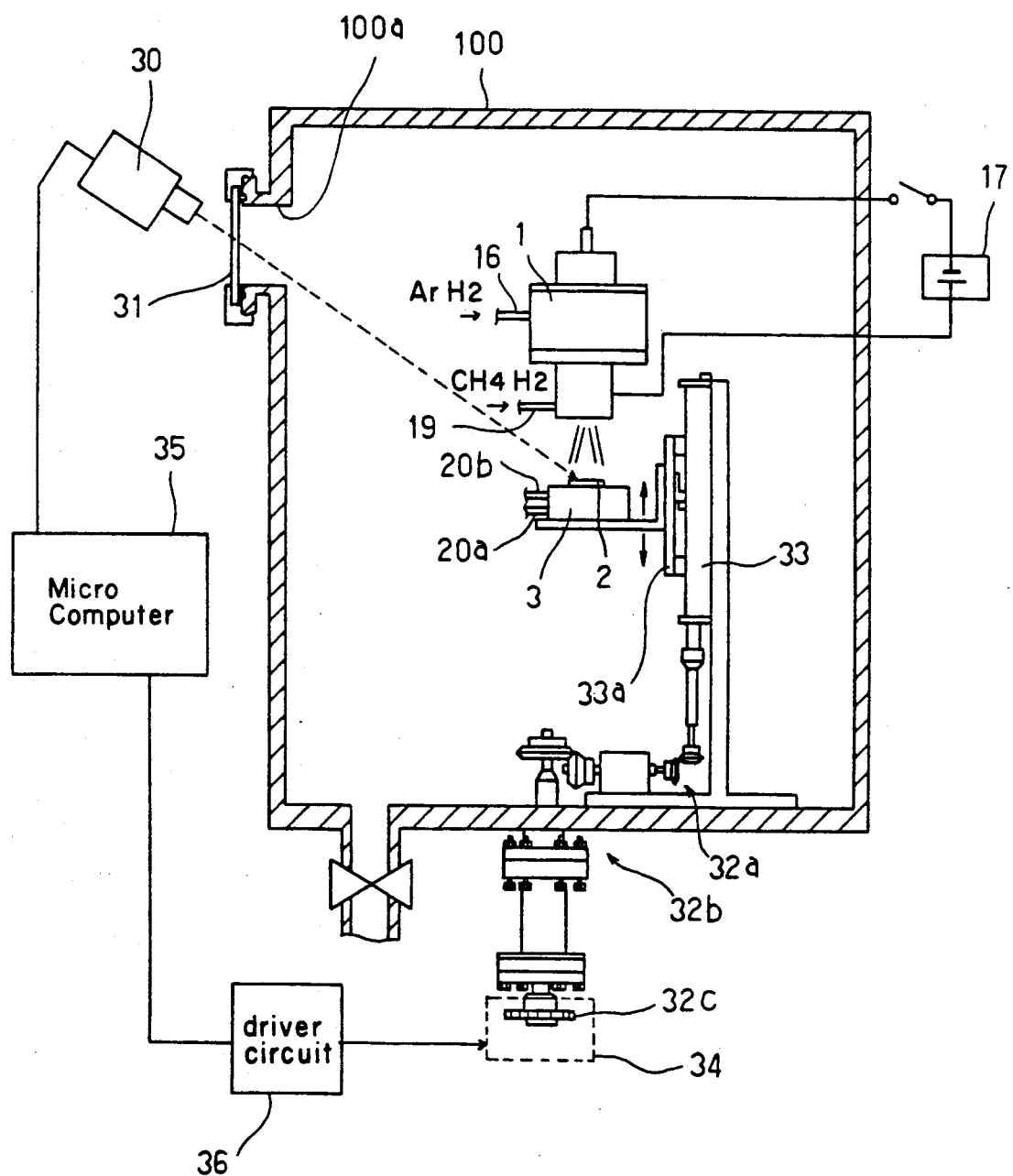
FIG. 2 is a schematic sectional view of an embodiment of a diamond film forming apparatus according to the present invention.

In the embodiment of the diamond film forming apparatus shown in FIG. 2, a plasma jet generator 1 is disposed within a casing 100 in which the vacuum is maintained at 50 Torr by means of a vacuum pump not shown, and electrically connected to an arc power supply source 17 to generate a direct current arc discharge therein. In order to introduce a plasma source gas such as Ar and $H_2$ and a carbon source gas such as $CH_4$ into the discharge area within the plasma jet generator 1, a gas inlet pipe 16 and a gas inlet pipe 19 are connected to the plasma jet generator 1. Under plasma jet generator 1, a sample bed 3, on which a substrate 2 is set to form a diamond film, is supported by a holding member 33a which is attached to a sliding mechanism 33. This mechanism 33 can be slided upward or downward by transmission 32a, 32b, and 32c which is connected to a stepping motor 34. The stepping motor 34 is electrically connected to a driver circuit 36 to receive a driving current and the driver circuit 36 is connected to a microcomputer 35 which carries out a predetermined control program and outputs a control signal for driving the stepping motor 34 in response to data of the surface temperature of the diamond film on the substrate 2.

According to this embodiment, a radiation thermometer 30 as a detecting means is used for directly detecting the surface temperature of the diamond film. Namely, the radiation thermometer 30 optically detects the surface temperature through a transparent window 31 provided in an opening 100a of the casing 100.

Figure 3:
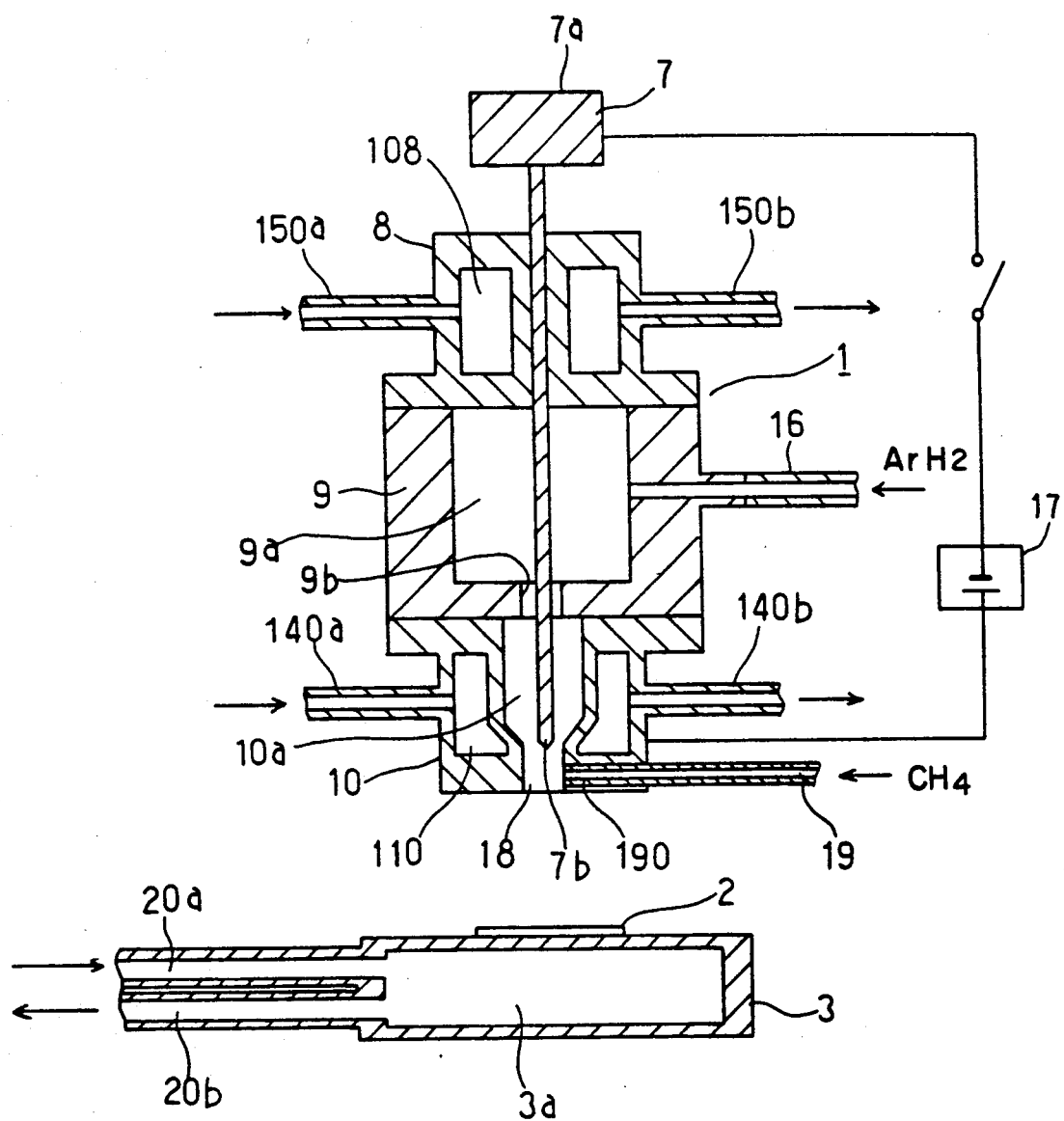
FIG. 3 is an enlarged sectional view of a portion illustrated in FIG. 2.

The structure of the plasma jet generator 1 is explained in more detail with reference to FIG. 3. The plasma jet generator 1 comprises a positive electrode 10 and a needle-shaped negative electrode 7 both of which are connected to the arc power source 17, an electrode cooling portion 8 provided around the upper needle portion of the negative electrode 7, and a gas chamber casing 9 provided between the electrode cooling portion 8 and the positive electrode 10.

The positive electrode 10 and the electrode cooling portion 8 are connected to cooling water inlet pipes 140a and 150a respectively so as to introduce cooling water into a hollow portion 110 of the positive electrode 10 and a hollow portion 108 of the electrode cooling portion 8, and connected to cooling water outlet pipes 140b and 150b respectively. The cooling water prevents the damage or wear of the electrodes 7 and 10 due to the heat of the arc discharge generated between the electrodes 10 and 7.

A gas inlet pipe 16 is connected to the cylindrical portion of the gas chamber casing 9 to introduce a mixture gas of Ar and $H_2$ into a gas chamber 9a. The gas chamber 9a is communicated with a discharge chamber 10a through an opening 9b to form a gas plasma in the discharge chamber 10a formed in the positive electrode 10, when a direct arc discharge occurs between the positive electrode 10 and a tip end 7b. The inner diameter of the lower portion of discharge chamber 10 is throttled to form plasma a jet port 18 in which $CH_4$ is introduced from an inlet port 190 of a gas inlet pipe 19.

The sample bed 3 to be disposed under the plasma jet port 18 is provided with a cooling water inlet pipe 20a and a cooling water outlet pipe 20b to introduce cooling water into a hollow portion 3a provided therein. As the temperature of the plasma gas injected from the plasma jet port 18 reaches a higher temperature more than thousands of ° C. The cooling water maintains the temperature of the substrate 2 between 600° C. through 1100° C. under which a diamond film can be formed on the substrate 2.

Figure 4:
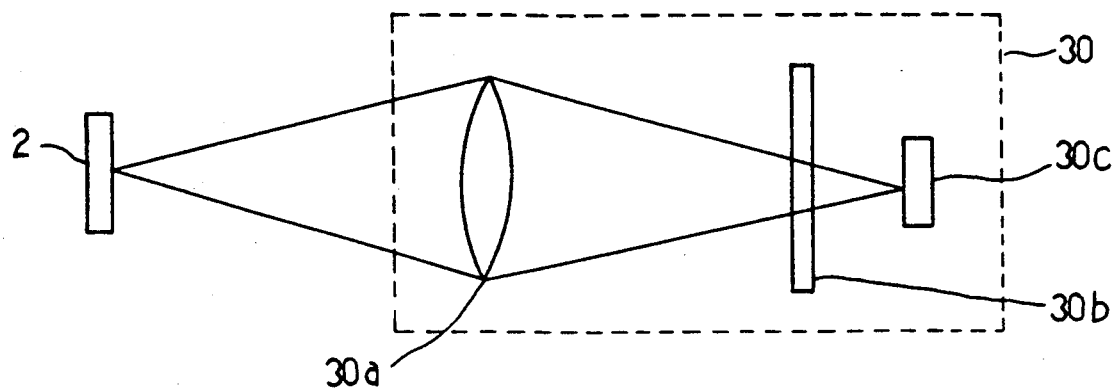
FIG. 4 is a schematic view of a radiation thermometer illustrated in FIG. 2.

In FIG. 4, a scheme of a radiation thermometer 30, which detects an intensity of a luminance brightness on the diamond film surface, is shown. According to this embodiment, the thermometer 30 includes a convex lens 30a to collect the radiation from the surface of the diamond film being formed on the substrate 2, a filter 30b to pass through the collected light having a predetermined wave length, and a detector 30c such as a photo-diode array. The detector 30c detects the intensity of the luminance brightness of the diamond film surface which changes in response to the temperature of the diamond film surface, and outputs an electric signal corresponding to the detected intensity. The output signal is converted to digital data by an A-D converter and thereafter is input to the microcomputer 35.

The method for forming a diamond film using the above-described apparatus of the embodiment will be explained hereinafter.

At first, the casing 100 is exhausted, and then a gas of group 0 of the periodic table, such as an argon gas (Ar) is introduced into the gas chamber 9a of the plasma jet generator 1 through the gas inlet pipe 16 to maintain the inner pressure of the casing at 100 to 50 Torr. Thereafter, a direct current arc discharge is generated between the positive electrode 10 and the negative electrode 7 by means of the arc power source 17 under the condition of 40 V and 50 A. After the arc discharge becomes stable, a mixture gas containing 60 vol.% of an argon gas and 40 vol.% of a hydrogen gas is inroduced ot the gas chamber 9a through the gas inlet pipe 16 at the flow rate of 15 l/min, and a mixture gas containing a methane gas of 60 cc/min and a hydrogen gas of 200 cc/min is introduced to the plasma jet port 18 through the gas inlet pipe 19. At this time, the casing 100 is continuously exhausted to maintain the inner pressure at 50 Torr.

The mixture gas of argon and hydrogen flows into the discharge chamber 10a and becomes a plasma gas therein when the direct current arc discharge occurs between the inner surface of the discharge chamber 10a and the tip end 7b. This plasma gas is mixed with the methane gas at the plasma jet port 18 and injected therefrom onto the substrate 2. As the arc discharge proceeds, the temperature of the center of plasma gas exceeds 3000° K. and the diamond film is formed on the substrate 2 by such high temperature gas plasma.

The method for controlling the surface temperature of the diamond film being formed by the above method so as to maintain it at a predetermined value will be explained below in detail.

Figure 5:
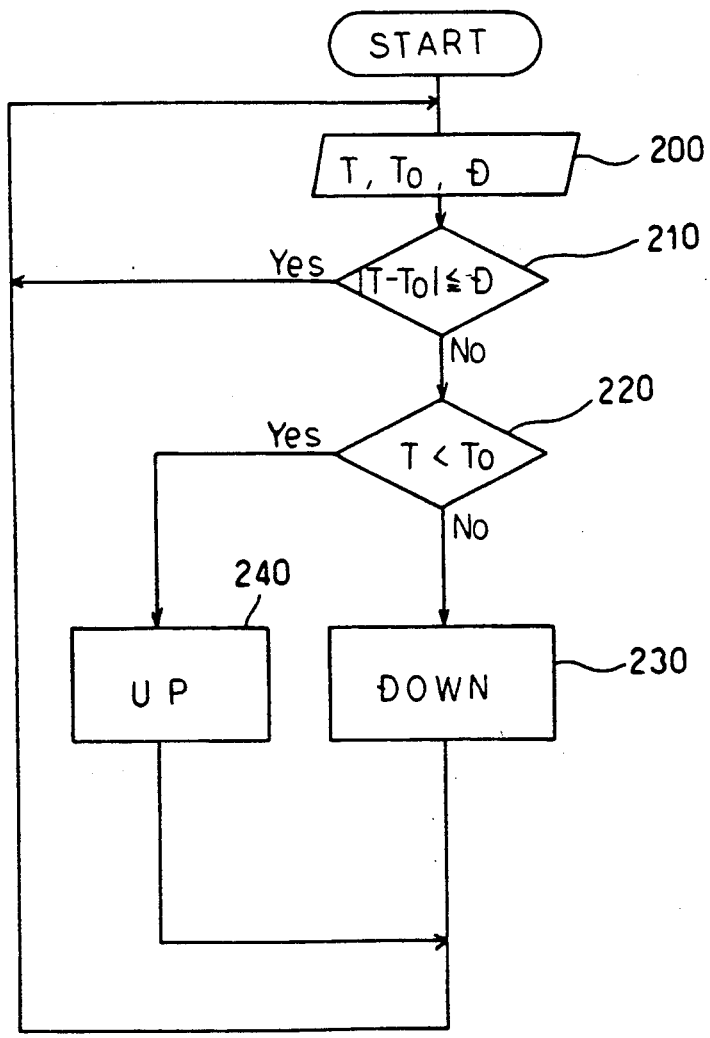
FIG. 5 is a flow chart of a control carried out by a microcomputer illustrated in FIG. 2.

In response to the start of the arc discharge by means of the arc power source 17, the microcomputer 35 starts to carry out a control shown in FIG. 5. The control cycle from steps 200 through 240 will be continued during the arc discharge. In the first step 200, the necessary data for the control is read and memorized in RAM of the computer 35. Such data includes data "T" corresponding to the actual film surface temperature detected by the radiation thermometer 30, data "$T_0$" as a target temperature of the forming surface of the diamond film, and data "D" as a constant which indicates a predetermined allowable deviation of the actual temperature T from the target temperature $T_0$. Data $T_0$ is usually determined between 800° C. through 1100° C., under which the diamond film can be formed, in accordance with the composition and pressure of the plasma source gas and carbon source gas. In this particular embodiment, $T_0$ is set at 900° C. and data D is set at 20° C. If the temperature $T_0$ is lower than 800° C., a possibility of an occurrence of an amorphous carbon increases. If the temperature $T_0$ is higher than 1000° C., a possibility of an occurrence of a graphite increases.

In the step 210, the difference between T and $T_0$ is compared with data D. If the difference is equal or smaller than data D, the program returns to the step 200. If the detected actual temperature T is lower than the target temperature $T_0$ by more than D, the program proceeds through the step 220 to the step 240 and a control signal is produced from the microcomputer 35 to the driver circuit 36 so as to actuate the stepping motor 34 in such a direction as the holding member 33a goes up. As a result of this control, the surface temperature of the diamond film rises to get close to the target temperature $T_0$. If the detected temperature T is higher than the target temperature $T_0$ by more than D, the program proceeds through the step 220 to the step 230 and a control signal is output from the microcomputer 35 so that the holding member 33a goes down. As a result of this control, the surface temperature of the diamond film reduces to close to the target temperature $T_0$.

As explained above, the surface temperature of the diamond film being formed on the substrate 2 is maintained between 880° C. and 920° C. by the feedback control.

According to the present embodiment, the diamond film was formed at the rate of 30 μm/Hr, which is considerably fast, under the above condition; moreover, the high purity diamond film is formed irrespective of the thickness of the forming time thereof because the surface temperature of the diamond film is maintained at around target temperature which is optimal for forming the diamond film.

Figure 6:
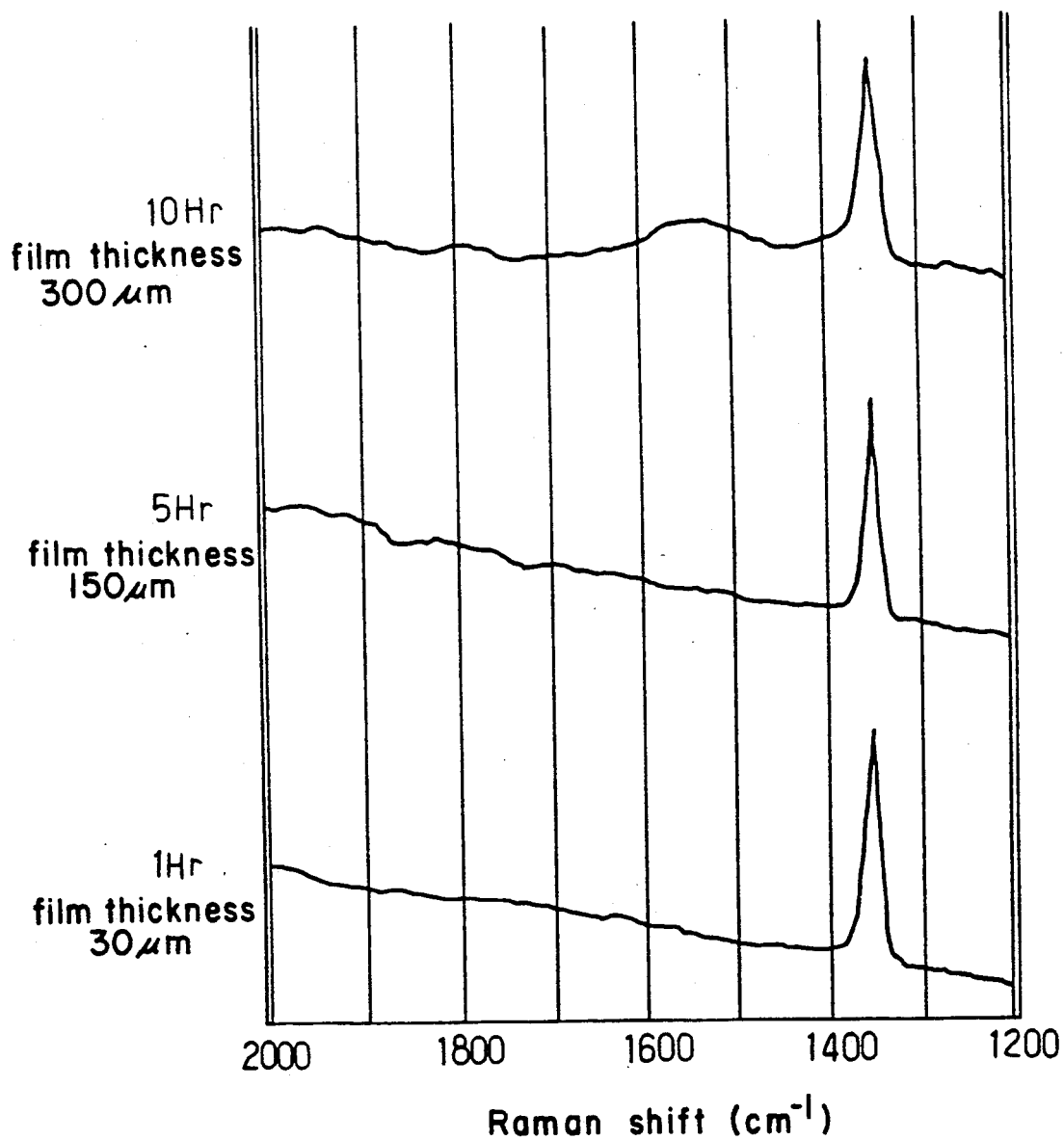
FIG. 6 is a graph shwoing Raman spectrum of a diamond film formed by the embodiment of the present invention.

In FIG. 6, the Raman spectrum data at the time of 1 Hr, 5 Hr and 10 Hr from the start of the growth is shown. This data clearly indicates the existence of the diamond film around the Raman peak of 1330 $cm^{-1}$. However, a peak of the impurity carbon is only slightly observed even if the forming time reaches 10 Hr (the thickness of diamond film is about 300 μm).

The present invention is not limited to the above-described embodiment, but the other apparatus and method may be applied thereto.

The temperature of the diamond film is adjusted by means of the arc power source 17 instead of the substrate position control means of sliding mechanism 33, transmission 32a through 32c and stepping motor 34. According to this method, the arc power is controlled in response to the detected temperature of the diamond film in such a way that the power is reduced when the temperature rises and that it is increased when the temperature goes down. In this case, it is required to change the power by the predetermined rate for the purpose of preventing the unstable discharge.

By means of controlling the flow rate or the temperature of the cooling water flowing into the hollow portion 3a of the sample bed 3, the surface temperature of the diamond film is also controlled, provided such control by cooling water is combined with the substrate position control or the arc power control.

Instead of directly detecting the surface temperature of the diamond film by the radiation thermometer 30, it can be indirectly detected by means of detecting other factors, which have an influence on the surface temperature of the diamond film, such as the thickness or forming time of the diamond film under a condition regarding an arc power, plasma source gas, carbon source gas and so on.

Figure 1:
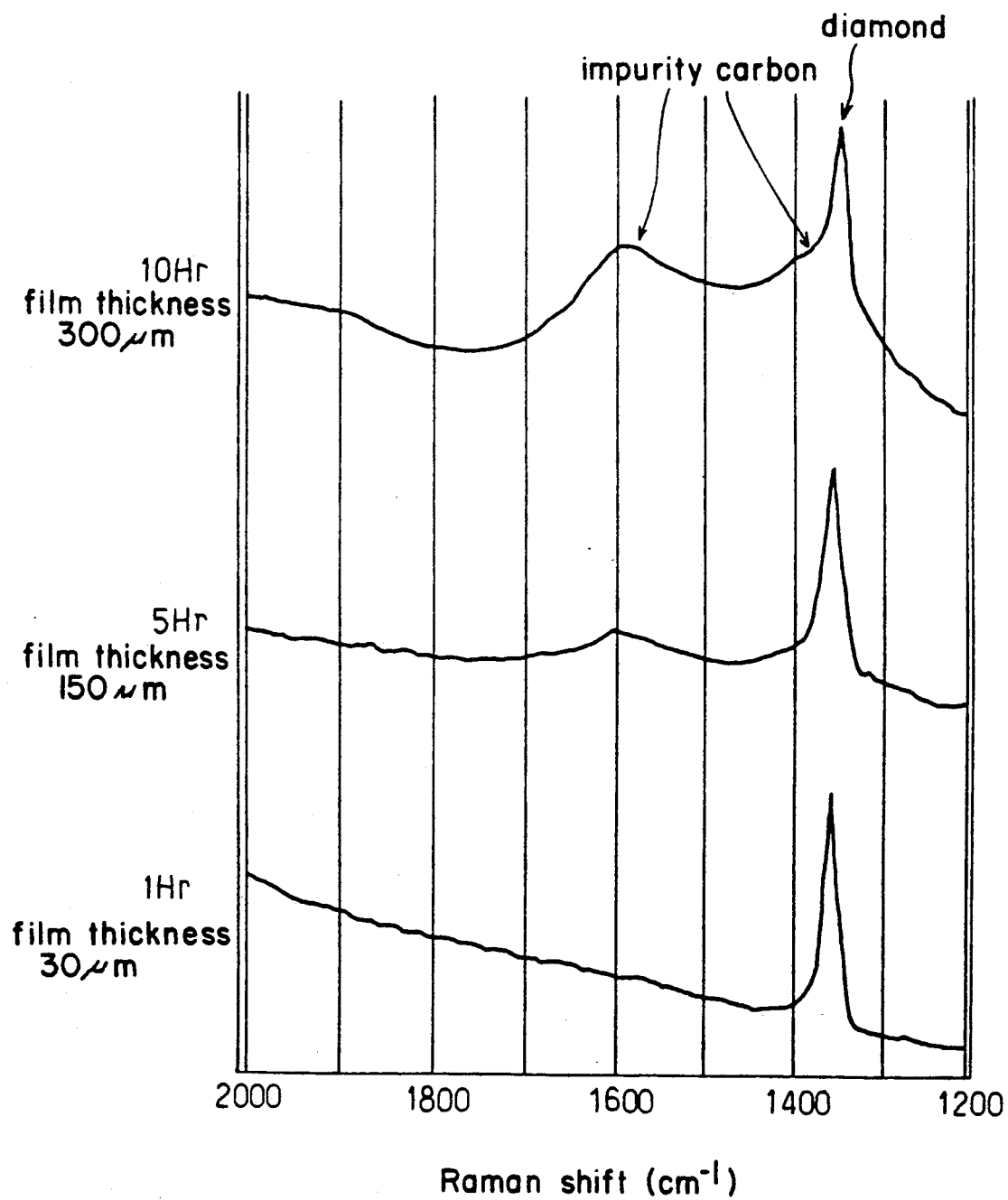
FIG. 1 is a graph showing Raman spectrum of a diamond film formed by a prior art method.

The present invention can be applied to not only the present method for forming a diamond film using a plasma jet, but also such a method for forming a diamond film without using plasma jet as shown in FIG. 1 of U.S. Pat. No. 4,851,254.

What is claimed is:

1. An apparatus for forming a diamond film comprising:
    a casing in which pressure is maintained to a predetermined value;
    supporting means for supporting within said casing a substrate on which said diamond film is to be formed;
    gas supplying means for supplying at least carbon source gas and plasma source gas into said casing;
    plasma generating means for generating gas plasma near said substrate from said carbon source gas and plasma source gas;
    temperature detecting means for detecting a temperature of a forming surface of said diamond film and for producing a detecting signal indicative of a detected forming temperature of said diamond film, while said diamond film is being formed;
    control signal producing means, electrically connected to said temperature detecting means so as to receive said detecting signal, for determining a control signal for maintaining said forming surface temperature near a predetermined optimal temperature of said diamond film in response to said detecting signal, and for producing said control signal; and
    temperature adjusting means, electrically connected to said control signal producing means, for adjusting said forming temperature based on said control signal so that said forming surface temperature is maintained near said optimal temperature while said diamond film is being formed.

2. An apparatus as claimed in claim 1, wherein said temperature detecting means is provided outside said casing and optically detects said forming surface temperature through a window of said casing.

3. An apparatus as claimed in claim 1, wherein said temperature detecting means includes a photo sensitive element which detects a luminous brightness of said forming surface of said diamond film.

4. An apparatus as claimed in claim 1, wherein said control signal producing means produces said control signal only when a difference between said detected forming surface temperature and said optimal temperature exceeds a predetermined value.

5. An apparatus as claimed in claim 1, wherein said temperature adjusting means adjusts said forming surface temperature within in a range between 800° C. and 1000° C.

6. An apparatus for forming a diamond film comprising:
- a casing in which pressure is maintained to a predetermined value;
- supporting means for supporting within said casing a substrate on which said diamond film is to be formed;
- gas supplying means for supplying at least carbon source gas and plasma source gas into said casing;
- plasma generating means for generating gas plasma near said substrate from said carbon source gas and plasma source gas;
- temperature detecting means for detecting a temperature of a forming surface of said diamond film and for producing a detecting signal indicative of a detected forming temperature of said diamond film, while said diamond film is being formed;
- control signal producing means, electrically connected to said temperature detecting means so as to receive said detecting signal, for determining a control signal for maintaining said forming surface temperature near a predetermined optimal temperature of said diamond film on the basis of a difference between said detected forming surface temperature and said predetermined optimal temperature, and for producing said control signal; and
- temperature adjusting means, electrically connected to said control signal producing means so as to receive said control signal, for adjusting a position of said supporting means in response to said control signal so that said forming surface temperature is maintained near said optimal temperature while said diamond film is being formed.

7. An apparatus as claimed in claim 6, wherein said control signal producing means produces said control signal only when a difference between said detected forming surface temperature and said optimal temperature exceeds a predetermined value.

8. An apparatus as claimed in claim 6, wherein said temperature adjusting means adjusts said position of said supporting means in a way that a distance between said substrate and said gas plasma generating means increases when said forming surface temperature is higher than said optimal temperature by a predetermined value.

* * * * *